United States Patent
Rosenius et al.

(10) Patent No.: US 11,393,958 B2
(45) Date of Patent: Jul. 19, 2022

(54) LIGHT EMITTING DEVICE TO IMPROVE THE EXTRACTION EFFICIENCY

(71) Applicant: SONY CORPORATION, Tokyo (JP)

(72) Inventors: Samuel Kim Rosenius, Kanagawa (JP); Mamoru Suzuki, Kanagawa (JP)

(73) Assignee: SONY CORPORATION, Tokyo (JP)

(*) Notice: Subject to any disclaimer, the term of this patent is extended or adjusted under 35 U.S.C. 154(b) by 867 days.

(21) Appl. No.: 16/087,325

(22) PCT Filed: Mar. 14, 2017

(86) PCT No.: PCT/JP2017/010199
§ 371 (c)(1),
(2) Date: Sep. 21, 2018

(87) PCT Pub. No.: WO2017/169741
PCT Pub. Date: Oct. 5, 2017

(65) Prior Publication Data
US 2021/0226102 A1    Jul. 22, 2021

(30) Foreign Application Priority Data
Mar. 30, 2016   (JP) .............................. JP2016-067490

(51) Int. Cl.
*H01L 33/54*   (2010.01)
*H01L 33/20*   (2010.01)

(52) U.S. Cl.
CPC .............. *H01L 33/54* (2013.01); *H01L 33/20* (2013.01)

(58) Field of Classification Search
CPC .............................. H01L 33/20; H01L 33/54
See application file for complete search history.

(56) References Cited

U.S. PATENT DOCUMENTS

| 6,946,687 B2* | 9/2005 | Eisert ...................... H01L 33/08 257/103 |
| 7,268,371 B2* | 9/2007 | Krames ................... H01L 33/02 257/98 |
| 9,082,926 B2* | 7/2015 | Freund .................... H01L 33/12 |

(Continued)

FOREIGN PATENT DOCUMENTS

| JP | 10-341035 A | 12/1998 |
| JP | 2005-252086 A | 9/2005 |

(Continued)

OTHER PUBLICATIONS

International Search Report and Written Opinion of PCT Application No. PCT/JP2017/010199, dated Apr. 18, 2017, 09 pages of ISRWO.

(Continued)

*Primary Examiner* — Stephen M Bradley
(74) *Attorney, Agent, or Firm* — Chip Law Group

(57) ABSTRACT

A light emitting device includes a semiconductor layer having a light extraction surface and side surfaces. The semiconductor layer includes a cladding layer and an active layer. The cladding layer has the extraction surface and a cladding layer side surface of the side surfaces, the cladding layer side surface being arranged at a first angle to the extraction surface. The active layer has an active layer side surface of the side surfaces, the active layer side surface being arranged at a second angle different from the first angle to the extraction surface.

17 Claims, 12 Drawing Sheets

(56) References Cited

U.S. PATENT DOCUMENTS

| | | | |
|---|---|---|---|
| 9,490,393 B2 * | 11/2016 | Wakai | H01L 33/44 |
| 2005/0264172 A1 * | 12/2005 | Wojnarowski | H01L 33/08 |
| | | | 313/498 |
| 2006/0169997 A1 * | 8/2006 | Suzuki | H01L 33/20 |
| | | | 257/95 |
| 2014/0361321 A1 * | 12/2014 | Saito | H01L 33/005 |
| | | | 257/89 |
| 2015/0295131 A1 * | 10/2015 | Saito | H01L 33/0075 |
| | | | 257/76 |

FOREIGN PATENT DOCUMENTS

| | | | |
|---|---|---|---|
| JP | 2006-196694 A | 7/2006 |
| JP | 2014-120550 A | 6/2014 |
| JP | 2015-162566 A | 9/2015 |

OTHER PUBLICATIONS

Office Action for CN Patent Application No. 201780018970.6 dated Oct. 9, 2020, 04 pages of Office Action and 05 Pages of English Translation.

* cited by examiner

| Light emitted color | Material | Refractive index (n1) | β (resin interface) [°] |
|---|---|---|---|
| Red | AlGaInP | ≈3.3 | 45±13.5 ≈ 32~59 |
| Blue | GaN | ≈2.5 | 45±18.4 ≈ 27~63 |
| Green | GaP | ≈3.4 | 45±13.1 ≈ 32~58 |

| Light emitted color | Material | Refractive index (n1) | α (assumption) [°] | β (resin interface) [°] |
|---|---|---|---|---|
| Red | AlGaInP | ≈3.3 | 60 | 15±13.5≈2~29 |
| Blue | GaN | ≈2.5 | 60 | 15±18.4≈0~33 |
| Green | GaP | ≈3.4 | 60 | 15±13.1≈2~28 |

LIGHT EMITTING DEVICE TO IMPROVE THE EXTRACTION EFFICIENCY

CROSS REFERENCE TO RELATED APPLICATIONS

This application is a U.S. National Phase of International Patent Application No. PCT/JP2017/010199 filed on Mar. 14, 2017, which claims priority benefit of Japanese Patent Application No. JP 2016-067490 filed in the Japan Patent Office on Mar. 30, 2016. Each of the above-referenced applications is hereby incorporated herein by reference in its entirety.

TECHNICAL FIELD

The present technology relates to a light emitting device using a semiconductor material.

BACKGROUND ART

Low (light) extraction efficiency is one significant problem of a semiconductor light emitting device. The extraction efficiency is a ratio of light emitted from an active layer of the light emitting device and light exited from the light emitting device. At an interface between a material having a high refractive index (semiconductor) and a material having a low refractive index (for example, air or resin), light incident at an angle greater than the critical angle is totally reflected. If the total reflection occurs at the extraction surface of the light emitting device, the light is confined within the light emitting device, is absorbed on an electrode, and is internally absorbed by the material of the light emitting device. As a result, the extraction efficiency is lowered.

A semiconductor light emitting device described in Patent Literature 1 includes a side surface oblique to an upper surface (extraction surface) and a bottom surface of the device (for example, see Patent Literature 1, paragraph [0032]). Yet, the semiconductor light emitting device is susceptible to further improvement in order to increase the extraction efficiency.

Patent Literature 2 discloses a semiconductor light emitting device in which a side surface of a semiconductor layer is formed in a curved shape (for example, see Patent Literature 2, paragraph [0013]).

CITATION LIST

Patent Literature

Patent Literature 1: Japanese Patent Application Laid-open No. 1998-341035
Patent Literature 2: Japanese Patent Application Laid-open No. 2006-196694

DISCLOSURE OF INVENTION

Technical Problem

However, the manufacturing costs of the semiconductor light emitting device of Patent Literature 2 are increased because the side surface is entirely processed to have a curved shape.

An object of the present disclosure is to provide a light emitting device capable of decreasing the manufacturing costs and improving light extraction efficiency.

Solution to Problem

In order to achieve the object, a light emitting device according to an embodiment of the present technology includes a semiconductor layer having a light extraction surface and side surfaces.

The semiconductor layer includes a cladding layer and an active layer.

The cladding layer has the extraction surface and a cladding layer side surface of the side surfaces, the cladding layer side surface being arranged at a first angle to the extraction surface.

The active layer has an active layer side surface of the side surfaces, the active layer side surface being arranged at a second angle different from the first angle to the extraction surface.

With this structure, from the light reflected by the active layer side surface, the amount of the light reflected by the extraction surface can be decreased. With this simple structure of the light emitting device, the manufacturing costs can be decreased and the extraction efficiency can be improved.

The extraction surface may be flat.

Thus, even if the extraction surface is flat, high extraction efficiency can be provided as long as the second angle satisfies the following appropriate condition.

The second angle may be set such that light generated at the active layer and reflected by the active layer side surface enters the extraction surface at an angle smaller than a critical angle.

High extraction efficiency can be provided as long as the second angle satisfies the predetermined expression.

The second angle may be set such that light generated at the active layer and reflected by the active layer side surface is reflected by the cladding layer side surface and exits from the extraction surface.

The extraction surface may have a concavo-convex part.

Thus, in a case where the extraction surface has a concavo-convex part, high extraction efficiency can be provided as long as the second angle satisfies the following appropriate condition.

The second angle may be set such that light generated at the active layer and reflected by the active layer side surface enters an internal surface of the concave part at an angle smaller than a critical angle.

A light emitting device according to another embodiment includes a semiconductor layer having a light extraction surface and side surfaces.

The semiconductor layer includes a cladding layer and an active layer.

The cladding layer has the extraction surface.

The active layer has an active layer side surface of the side surfaces, the active layer side surface being arranged in a convex shape curved outside the light emitting device.

Advantageous Effects of Invention

As described above, according to the present technology, the manufacturing costs can be decreased and the light extraction efficiency can be improved.

It should be noted that the effects described here are not necessarily limitative and may be any of effects described in the present disclosure.

MODE(S) FOR CARRYING OUT THE INVENTION

Hereinafter, embodiments of the present technology will be described with reference to the drawings. In the following description, with reference to the drawings, in order to point out the positions or the directions of the device and the components thereof, words such as "up", "down", "left", "right", "depth", "width", "horizontal", "vertical", and the like may be used and are for convenience of explanation. In other words, these words may be often used for easy understanding of explanation and may not be matched with the position or the direction where the device is actually produced or used.

1. First Embodiment

1. 1) Structure of Light Emitting Device

Figure 1A:
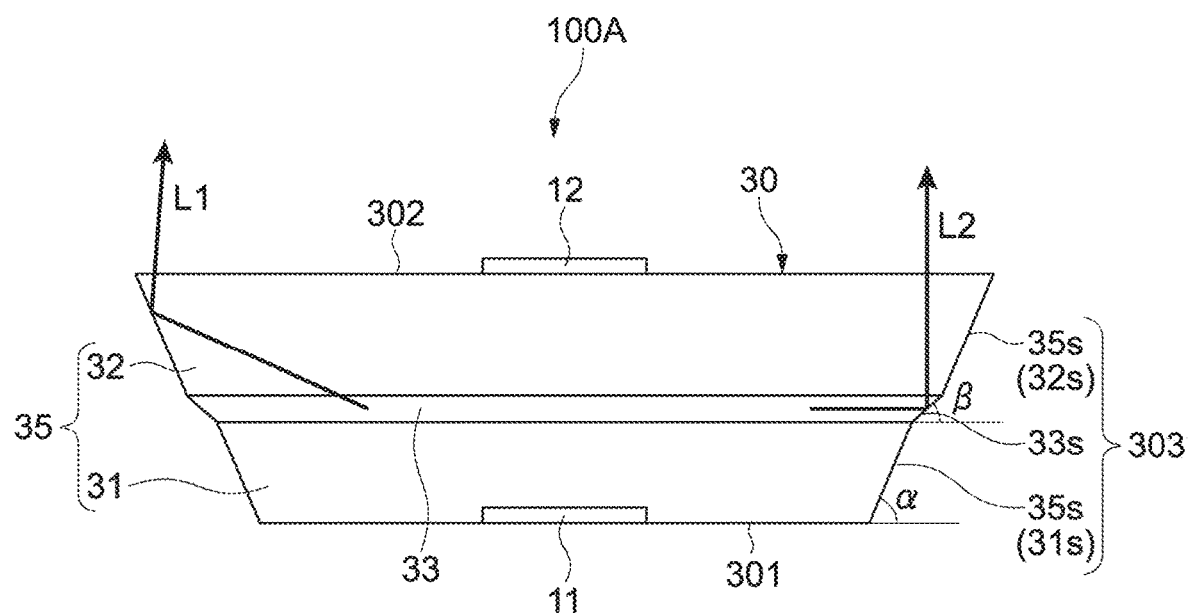
FIG. 1A is a cross-sectional view schematically showing a structure of a light emitting device according to a first embodiment of the present technology.

FIG. 1A is a cross-sectional view schematically showing a structure of a light emitting device according to a first embodiment of the present technology.

A light emitting device 100A is a semiconductor light emitting device, i.e., an LED (Light Emitting Diode). The light emitting device 100A includes a semiconductor layer 30. The semiconductor layer 30 includes a light extraction surface (upper surface) 302, side surfaces 303, and a bottom surface 301. For example, electrodes 11 and 12 are formed at the bottom surface 301 and the extraction surface 302, respectively.

The semiconductor layer 30 includes cladding layers 35 and an active layer 33. The cladding layers 35 include a first conductive layer 31 having the bottom surface 301 and a second conductive layer 32 having the extraction surface 302. Typically, the first conductive layer 31 is a p type conductive layer and the second conductive layer 32 is an n type conductive layer, and vice versa. The active layer 33 is arranged between the first conductive layer 31 and the second conductive layer 32.

The side surfaces 303 of the semiconductor layer 30 include cladding layer side surfaces 35s that are the side surfaces of the cladding layers 35 and an active layer side surface 33s that is the side surface of the active layer 33.

The extraction surface 302 is at least flat. In addition, the extraction surface 302 and the bottom surface 301 are substantially in parallel. An angle of inclination $\alpha$ (°) (first angle) of the cladding layer side surface 35s with respect to the extraction surface 302 is set such that the area of the extraction surface 302 is greater than the area of the bottom surface 301 in planer view.

In this embodiment, the angle of a side surface 31s of the first conductive layer 31 and the angle of a side surface 32s of the second conductive layer 32 are substantially the same $\alpha$. Hereinafter, an angle of inclination (second angle) of the active layer side surface 33s with respect to the extraction surface 302 is referred to as $\beta$ (°). According to the present technology, these angles $\alpha$ and $\beta$ are set to be different.

As shown in FIG. 1A, light generated at the active layer 33 and exited from the extraction surface 302 mainly includes a light component L1 and a light component L2. The light component L2 is a component of light that is generated at the active layer 33, is reflected by the active layer side surface 33s, and enters the extraction surface 302 at an angle smaller than a critical angle. The light component L1 is a component of light that is generated at the active layer 33, is reflected by the side surface 32s of the second conductive layer 32, and enters the extraction surface 302 at the angle smaller than the critical angle.

Figures 2, 3:
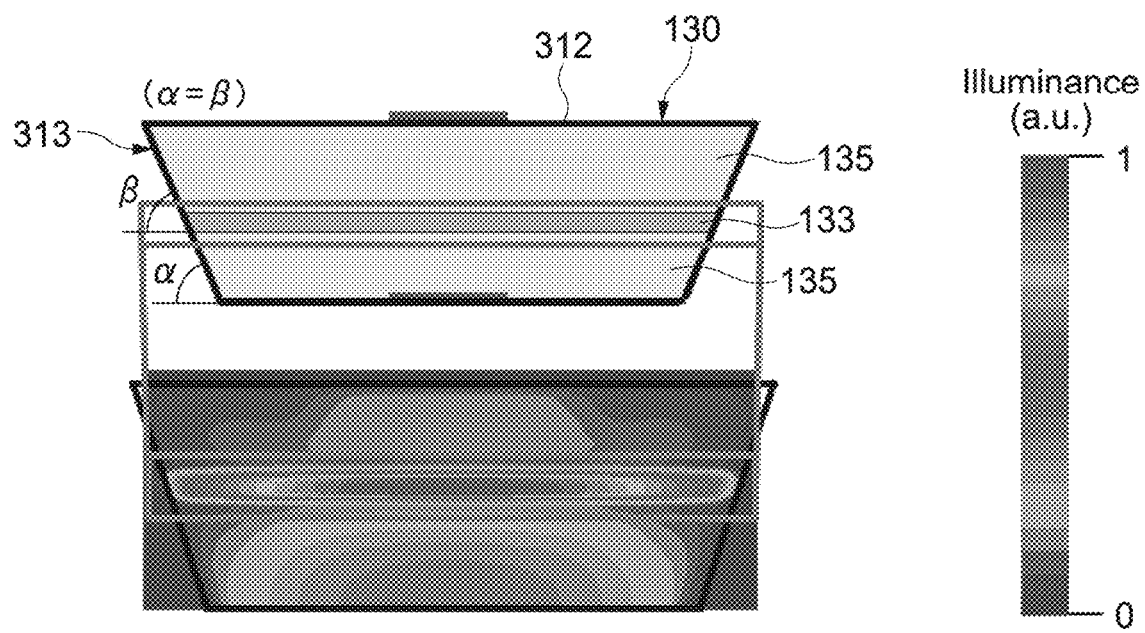
FIG. 2 shows a simulation image of an illuminance distribution about a light component reflected by an active layer side surface in a light emitting device according to a reference example.
FIG. 3 is a table showing appropriate angle of an active layer side surface in the light emitting device formed of a material that emits red, blue or green light in the first embodiment.

According to the present technology, the light component L2 is focused. FIG. 2 shows a simulation image of an illuminance distribution about the light component L2 reflected mainly by the active layer side surface 33s in a light emitting device according to a reference example. The light emitting device according to the reference example includes the structure similar to the semiconductor light emitting device described in Patent Literature 1, for example. The angle of the side surface 313 of the semiconductor layer 130 is fixed, i.e., $\alpha=\beta$. Note that FIG. 2 is a gray scale image, but original one is a color image.

As shown in FIG. 2, since most of the light generated in a width direction (horizontal direction) at the active layer 133 enters the top surface, i.e., the extraction surface 312, at an angle greater than the critical angle, the light reflected by the extraction surface 312 is easily gathered on the center of the cladding layers 35. Thus, the amount of light exited from the extraction surface 312 is decreased and extraction efficiency is not improved.

According to the idea of the present inventor, by setting the value of β to an appropriate value, the light incident on the extraction surface 302 at the angle smaller than the critical angle is increased. Specifically, in this embodiment, the β is set such that light generated at the active layer 33 and reflected by the active layer side surface 33s enters the extraction surface 302 at the angle smaller than the critical angle.

Figure 1B:
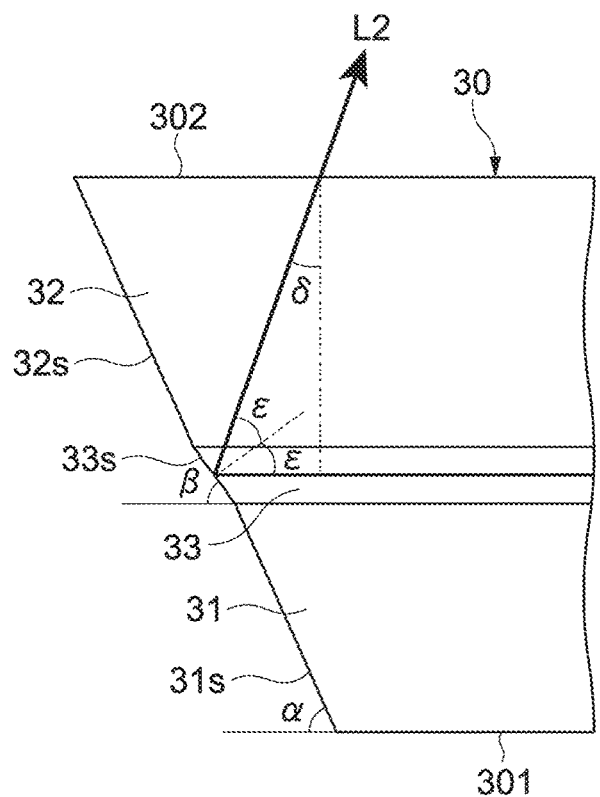
FIG. 1B is an enlarged view showing a side surface of a semiconductor layer of the light emitting device.

The present inventor verified by a simulation of a relationship between the angle β and the angle of the light exited from the extraction surface 302 (incident angle with respect to extraction surface 302) of the light emitting device 100A shown in FIG. 1A. FIG. 1B is an enlarged view showing the side surface 303 of the semiconductor layer 30 of the light emitting device 100A.

For example, in a case where the angle β is represented by the following Expression 1, a high extraction efficiency can be provided.

[Math. 1]

$$\beta = 45 \pm \frac{1}{2}\arcsin\frac{n_2}{n_1} \qquad \text{Expression 1}$$

$n_1$: refractive index of semiconductor layer 30
$n_2$: refractive index of material (insulator (resin) or air) around semiconductor layer 30

Hereinafter, a method of deriving the angle β will be described. As shown in FIG. 1B, angles ε (°), δ (°), and $\theta_c$ (°) are defined as follows:
ε: incident angle to active layer side surface 33s
δ: incident angle to extraction surface 302
$\theta_c$: critical angle of extraction surface 302

By the trigonometry, the angles of incidence ε and δ are represented by the following Expressions 2 and 3.

[Math. 2]

$$\varepsilon = 90 - \beta \qquad \text{Expression 2}$$

[Math. 3]

$$\delta = 90 - 2\varepsilon = -90 + 2\beta \qquad \text{Expression 3}$$

δ=0 is the condition for maximizing the light exited from the extraction surface 302. Here, it assumes that the light entering the active layer side surface 33s almost propagates in the horizontal direction of the active layer 33. Then, β=45 is the condition for maximizing the light exited from the extraction surface 302. In other words, when β=45, the light generated at the active layer 33 propagates in the horizontal direction and is reflected by the active layer side surface 33s in the vertical direction, whereby a highest extraction efficiency is thus provided.

The critical angle $\theta_c$ is represented by the following Expression 4.

[Math. 4]

$$\theta_c = \arcsin\frac{n_2}{n_1}, \ n_1 > n_2 \qquad \text{Expression 4}$$

From a conditional expression for exiting the light from the extraction surface 302, $\delta = \pm\theta_c$ and Expression 3, $-90 + 2\beta = \pm\theta_c$ is provided. From this expression and the Expression 4, β is provided as shown in Expression 1.

As described above, the light emitting device 100A according to this embodiment has a greatest feature that α and β are different. (Note that Expression 1 is held irrespective of α.) In a case where the angle β of the active layer side surface 33s of the light emitting device 100A has the condition of Expression 1, the extraction efficiency is improved. To be more specific, there is no need to form the curved side surfaces of the semiconductor layer as described in Patent Literature 2, the manufacturing costs can be decreased, and the extraction efficiency can be improved.

Note that the angles of inclination α and β can be controlled by changing etching parameters upon etching. Examples of the etching parameters include a gas type, a gas pressure, a gas amount, power, and the like. In particular, the angle can be controlled with high precision by ICP (Inductively Coupled Plasma)-RIE (Reactive Ion Etching).

1. 2) Example 1 and Effect Verification

For example, it assumes that α=62.5 and β=45. A material of the semiconductor layer 30 is an AlGaInP-based material that emits red light (refractive index $n_1$=3.3) and a sealing material arranged around the semiconductor layer 30 is resin (refractive index $n_2$=1.5). At this time, β=32 to 59. More preferably, β=36 to 54.

FIG. 3 is a table showing appropriate β of a light emitting device formed of a material that emits red light, a light emitting device formed of a material that emits blue light, and a light emitting device formed of a material that emits green light. The material that emits blue light of the semiconductor layer 30 is a GaN-based material. The material that emits green light of the semiconductor layer 30 is a GaP-based material.

Figure 4:
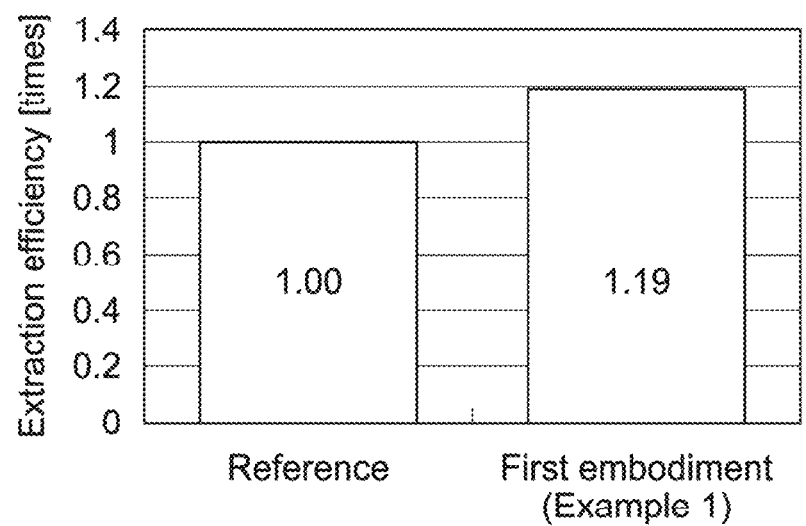
FIG. 4 is a graph showing a simulation result of each extraction efficiency of a semiconductor device (device that emits red light) of Example 1 and that of a reference example.

FIG. 4 is a graph showing a simulation result of each extraction efficiency of the semiconductor device (device that emits red light) of Example 1 according to this embodiment and that of the reference example. The light emitting device of the reference example has β=α=62.5°, and the material and the refractive index, both of which are similar to those of this embodiment. If the extraction efficiency of the reference example is 1.00, the extraction efficiency of this embodiment is 1.19.

2. Second Embodiment 2. 1) Structure of Light Emitting Device

Figure 5:
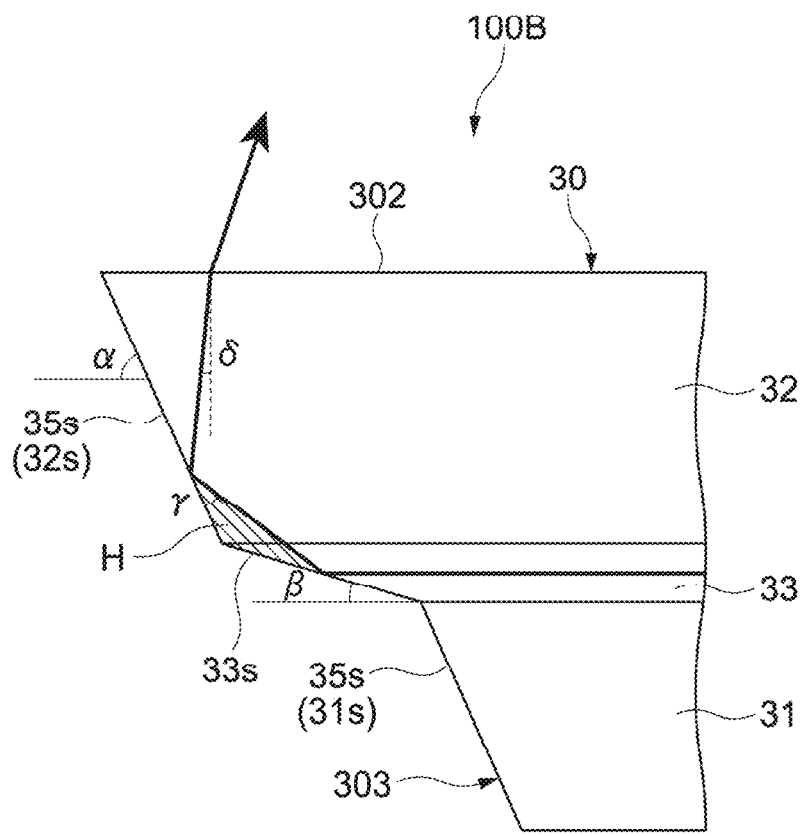
FIG. 5 is a cross-sectional view schematically showing a structure of a light emitting device according to a second embodiment of the present technology and a side surface of a semiconductor layer is enlarged.

FIG. 5 is a cross-sectional view schematically showing a structure of a light emitting device according to a second embodiment of the present technology and a side surface 303 of the semiconductor layer 30 is enlarged. Hereinafter, components substantially similar to the component, the functions, and the like of the light emitting device 100A according to the first embodiment are denoted by the same reference signs, and description thereof will be omitted or simplified. Different points will be mainly described.

A relationship between the angle α of the cladding layer side surface 35s of the light emitting device 100B according to this embodiment and the angle β of the active layer side surface 33s is represented by the following Expression 5.

[Math. 5]

$$\beta = \alpha - 45 \pm \frac{1}{2}\arcsin\frac{n_2}{n_1} \quad \text{Expression 5}$$

In the first embodiment, β is specified irrespective of α. In this embodiment, β is specified with respect to α. Specifically, as shown in FIG. 5, the angle β is such that light generated at the active layer 33 and reflected by the active layer side surface 33s is reflected (for example, one time) by the side surface 32s of the second conductive layer 32 that is the cladding layer side surface 35s and exits from the extraction surface 302.

On the condition that the following Expression 6 is satisfied, Expressions 7 and 8 are provided by using the trigonometry of the triangle shown by the reference sign H.

[Math. 6]

$$\alpha > 2\beta \quad \text{Expression 6}$$

[Math. 7]

$$\gamma = \alpha - 2\beta \quad \text{Expression 7}$$

[Math. 8]

$$\delta = 90 - 2\alpha + 2\beta \quad \text{Expression 8}$$

Similar to the first embodiment, δ=0 is the condition for maximizing the light exited from the extraction surface 302. Also, β=α−45 is the condition for maximizing the light exited from the extraction surface 302. Accordingly, from these conditions, Expressions 7 and 8, and Expression 4 of the critical angle $\theta_c$, Expression 5 is derived.

2. 2) Example 2 and Effect Verification

For example, it assumes that α=62.5 and β=45. A material of the semiconductor layer 30 is an AlGaInP-based material that emits red light (refractive index $n_1$=3.3) and a sealing material arranged around the semiconductor layer 30 is resin (refractive index $n_2$=1.5). At this time, β=2 to 29.

Figures 6, 7:
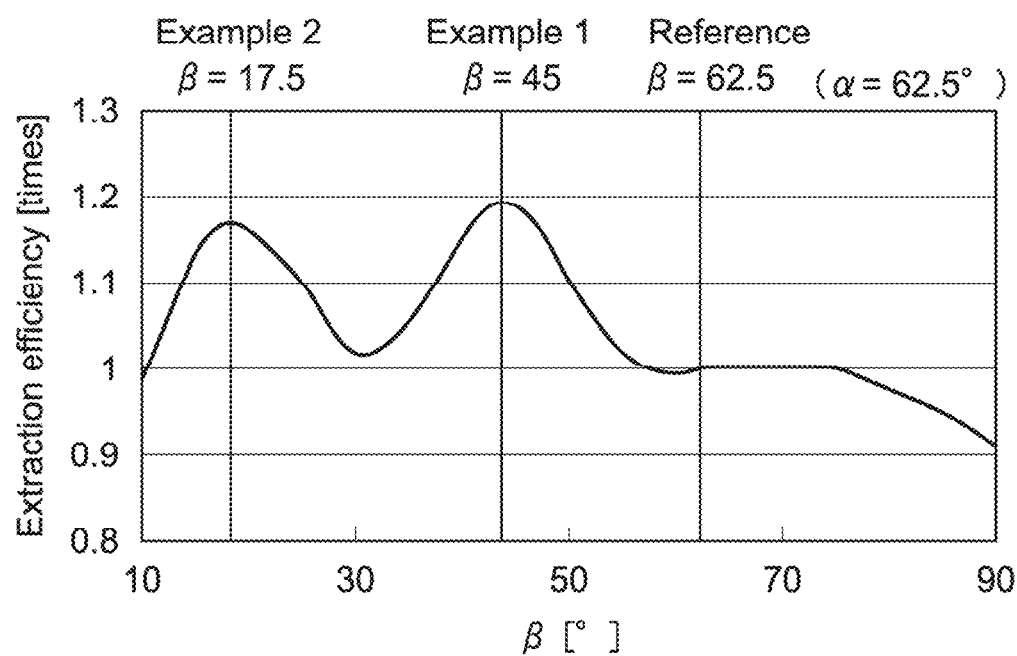
FIG. 6 is a table showing appropriate angle of an active layer side surface in the light emitting device formed of a material that emits red, blue or green light in the second embodiment.
FIG. 7 is a graph showing a verification result of each extraction efficiency by a light emitting device (device that emits red light) according to Example 2 and a light emitting device (device that emits red light) according to the first embodiment.

FIG. 6 is a table showing appropriate β of a light emitting device formed of a material that emits red light, a light emitting device formed of a material that emits blue light, and a light emitting device formed of a material that emits green light. α is set to 60, for example.

FIG. 7 is a graph showing a verification result of the extraction efficiency by the light emitting device 100B (device that emits red light) according to Example 2 of this embodiment and the light emitting device 100A (device that emits red light) according to Example 1 of the first embodiment.

Here, a length on a side of the extraction surface 302 in a square shape is 150 μm, a height of the light emitting device (here, mainly semiconductor layer 30) is 70 μm (first conductive layer 31 is 30 μm, active layer 33 is 10 μm, and second conductive layer 32 is 30 μm), for example. α=62.5 and β is a variable. As described above, taking the condition for maximizing the light exited from the extraction surface 302 into consideration, the optimal β is β=45 in Example 1 and β=17.5 in Example 2. FIG. 7 shows this.

Figure 8:
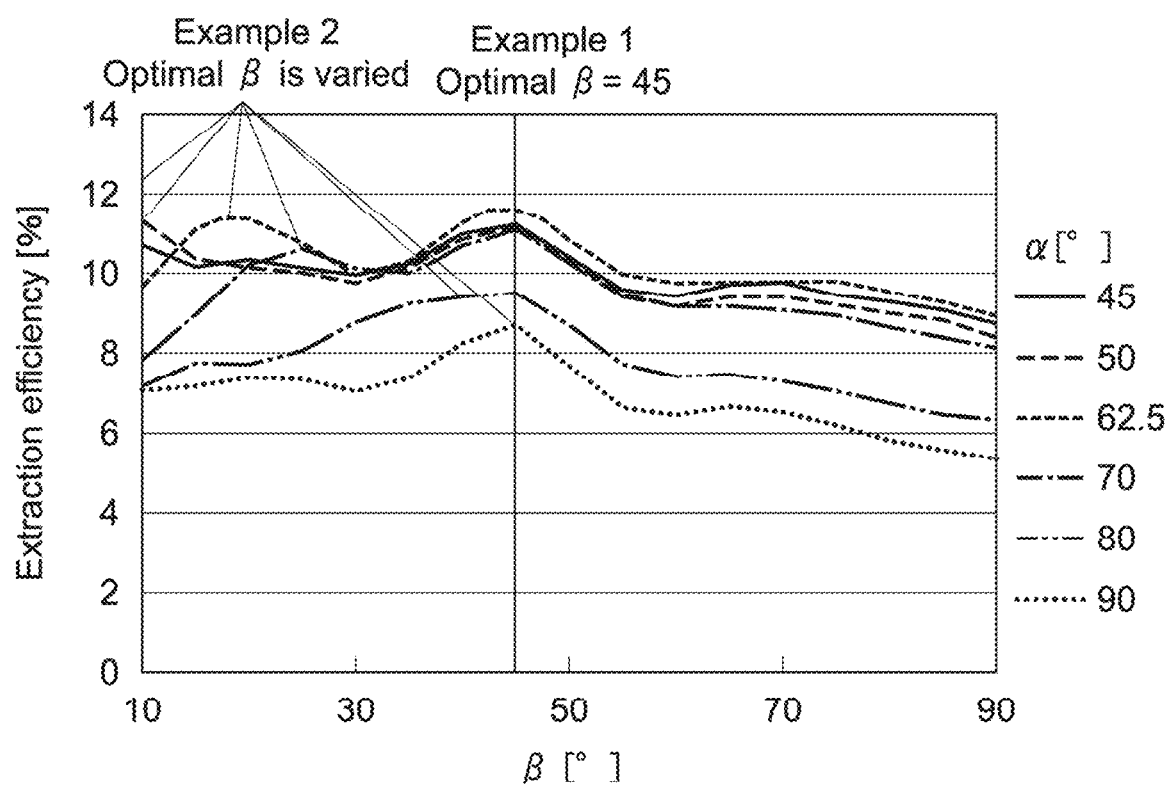
FIG. 8 shows a simulation result in a case where a is changed between 45 and 90 in a light emitting device according to Example 2.

FIG. 8 shows a simulation result in a case where a is changed between 45 and 90 in the light emitting device 100B according to Example 2. As apparent from Expression 1, even if a is any value, β is always 45°, which shows the first embodiment. Note that according to the present technology, since a α≠β, when β=45°, it employs a setting of a α≠45°.

On the other hand, the optimal β of the second embodiment (Example 2) varies together with a as shown in Expression 5.

Note that β in the first embodiment is determined irrespective of α (note that α≠β) and β in the second embodiment can be considered as a subordinate concept of the first embodiment. Accordingly, as shown in FIG. 8, both concepts can be drawn as the same line.

3. Third Embodiment

Figure 9A:
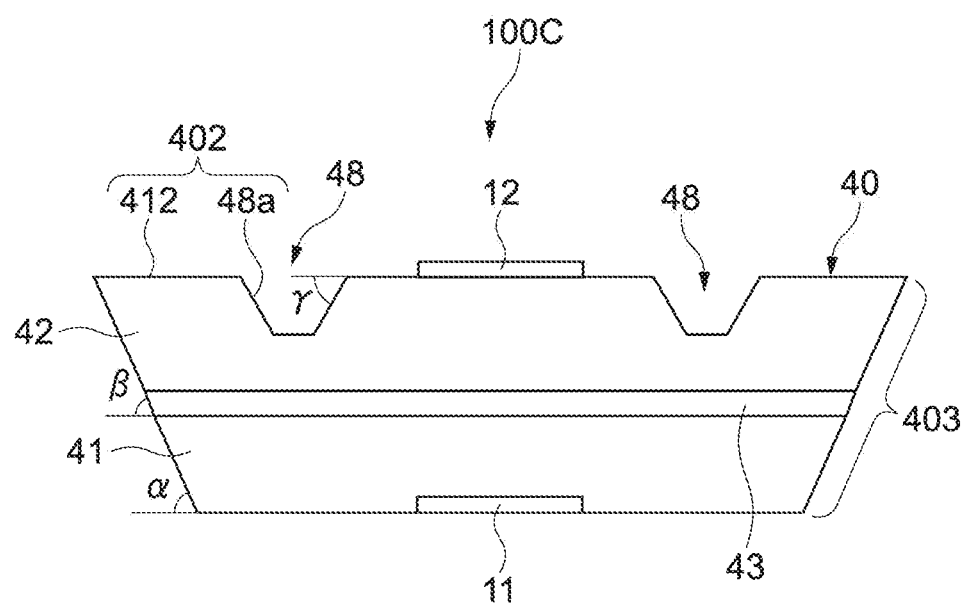
FIG. 9A is a cross-sectional view schematically showing a structure of a light emitting device according to a third embodiment of the present technology.
Figure 9B:
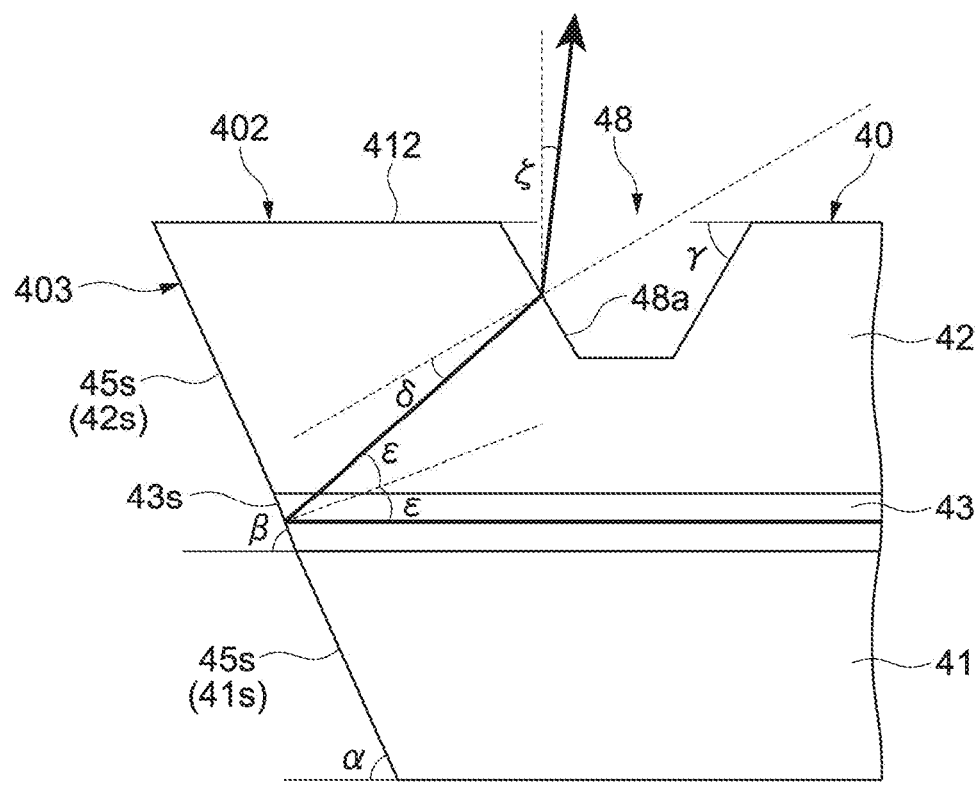
FIG. 9B is a view showing an enlarged side surface of a semiconductor layer of the light emitting device.

FIG. 9A is a cross-sectional view schematically showing a structure of a light emitting device according to a third embodiment of the present technology. FIG. 9B is a view showing an enlarged side surface 403 of a semiconductor layer 40 of a light emitting device 100C.

The extraction surface 402 of the light emitting device 100C has a pattern (concavo-convex part) including a concave part 48 formed. In other words, the extraction surface 402 includes a surface (upper surface 412) perpendicular to a lamination direction of the respective semiconductor layers (up and down directions in FIGS. 9A and 9B) and an internal surface 48a of the concave part 48. In FIGS. 9A and 9B, γ(°), δ(°), ζ(°) are defined as follows:

γ: angle of internal surface 48a of concave part with respect to upper surface 412

δ: incident angle to internal surface 48a of concave part

ζ: exit angle to upper surface 412

The β is set such that light generated at the active layer 43 and reflected by the active layer side surface 43s enters the internal surface 48a of the concave part 48 at the angle smaller than the critical angle. The β is represented by the following Expression 9 using γ.

[Math. 9]

$$\beta = \frac{1}{2}\left(90 + \gamma - \arcsin\left(\frac{n_2}{n_1}\sin(\gamma)\right)\right) \quad \text{Expression 9}$$

Expression 9 is derived from the following expressions 10 and 11. Expression 11 represents ζ using Expression 4 of the critical angle $\theta_c$ and γ.

[Math. 10]

$$\delta = 90 - 2\beta + \gamma \quad \text{Expression 10}$$

[Math. 11]

$$\zeta = \arcsin\left(\frac{n_1}{n_2}\sin(\delta)\right) - \gamma \quad \text{Expression 11}$$

For example, γ=62.5. In this case, if β=64.4, δ is optimal and light exits to the upper surface 412 in the vertical direction (ζ=0). This is the condition that the light exited from the extraction surface 402 is maximized.

Note that with respect to the arrangement of the concave part 48 in the extraction surface 402, the following Expression 12 should be satisfied.

[Math. 12]

$$h\left(\frac{1}{\tan(180-2\beta)} - \frac{1}{\tan\gamma}\right) \leq x \leq \frac{d}{\tan(180-2\beta)} \quad \text{Expression 12}$$

Figure 10A:
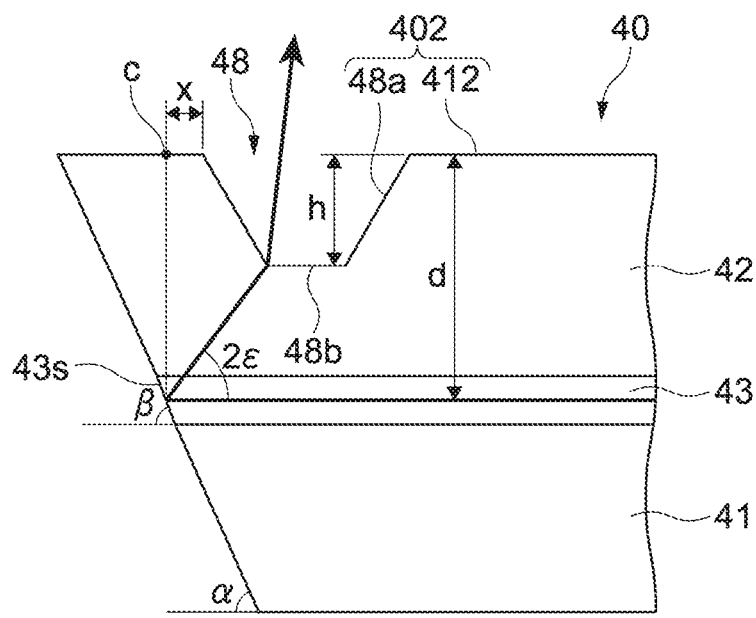
FIGS. 10A and 10B are views for explaining values x, h, and d in Expression 10.
Figure 10B:
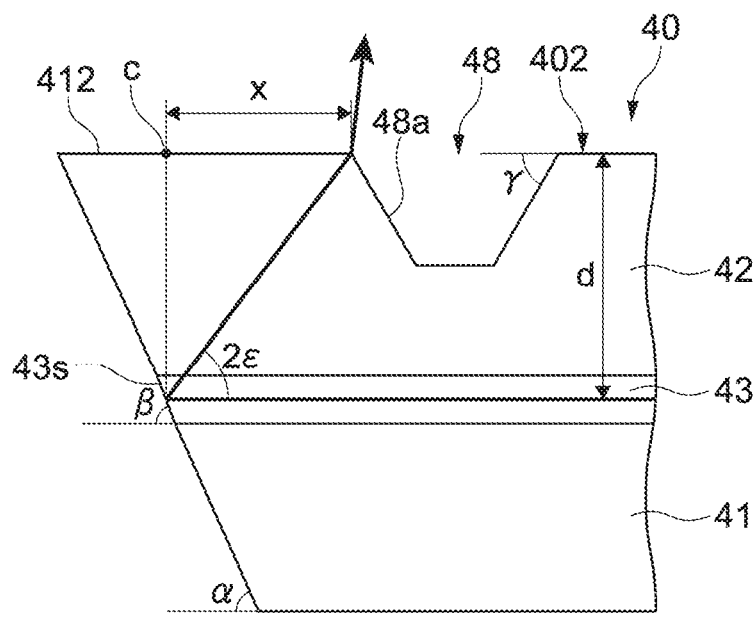

FIGS. 10A and 10B are views for explaining the values x, h, and d in Expression 10. The distance x is from a point c to an edge of the internal surface 48a of the concave part 48 (boundary between internal surface 48a and upper surface 412). The point c is a point of the upper surface 412, the point of the upper surface 412 corresponding to a light incident point of the active layer side surface 43s, i.e., an intersection point of a perpendicular line passing through the incident point and the upper surface 412. The h is a depth of the concave part 48, i.e., a distance from the upper surface 412 to bottom surface 48b of the concave part 48. The d is a depth from the upper surface 412 to the center of the active layer 43.

For example, if h=0.2 (mm) and d=1 (mm), the range of the x (mm) is 0.08≤x≤0.8 from Expression 12.

As described above, in a case where the extraction surface 402 has the pattern of the concavo-convex part, a high extraction efficiency is achieved by appropriately setting β.

4. Fourth Embodiment

Figure 11:
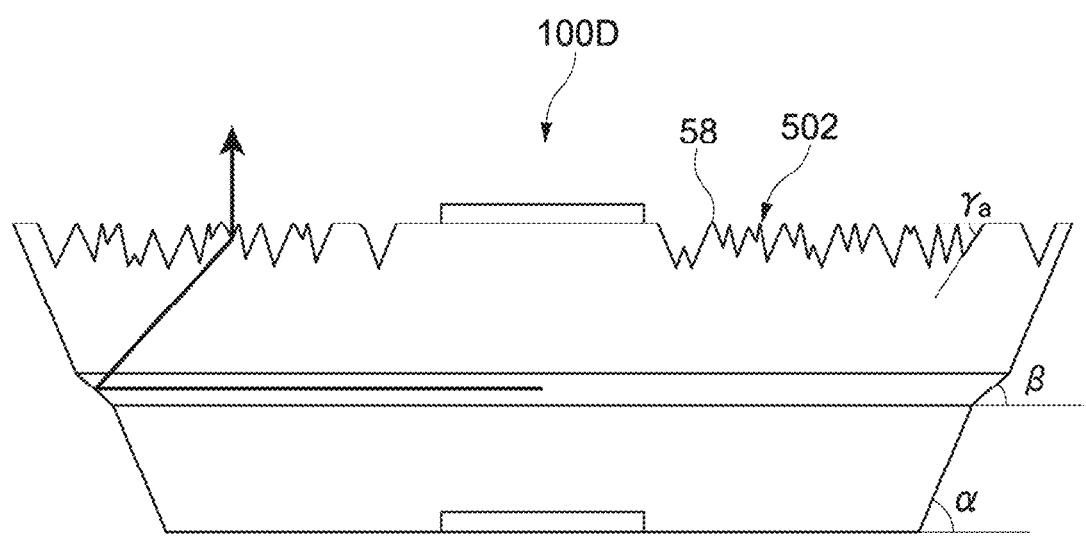
FIG. 11 is a cross-sectional view schematically showing a structure of a light emitting device according to a fourth embodiment of the present technology.

FIG. 11 is a cross-sectional view schematically showing a structure of a light emitting device according to a fourth embodiment of the present technology. An extraction surface 502 of a light emitting device 100D includes a random concavo-convex part 58. The angle γ of an internal surface of the concave part (or angle of external surface of convex part) with respect to the surface perpendicular to the respective semiconductor layers in the lamination direction has a distribution. There is a peak at a certain angle γ. Accordingly, in Expression 9, the γ may be replaced with $\gamma_a$ representing an average of the γ distribution. For example, if $\gamma_a$=45, β=58 at ζ=0.

5. Fifth Embodiment

Figure 12A:
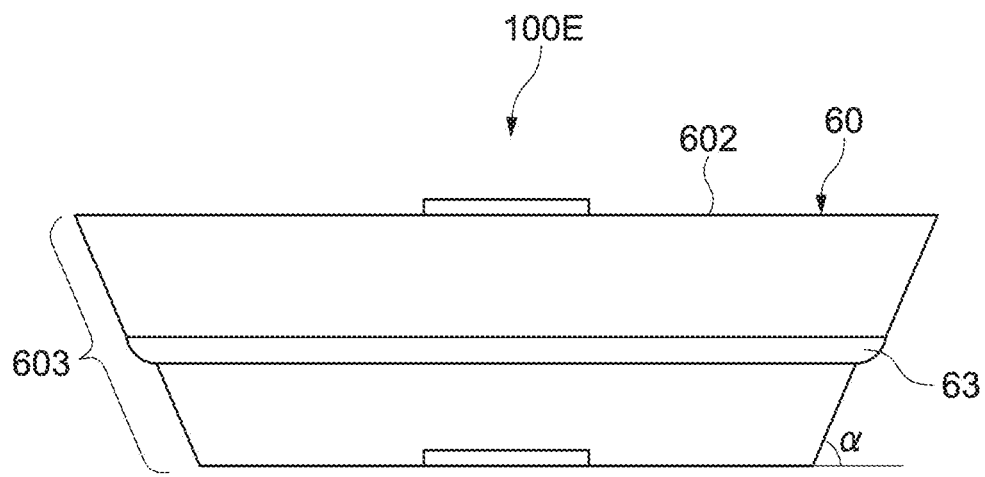
FIG. 12A is a cross-sectional view schematically showing a structure of a light emitting device according to a fifth embodiment of the present technology.
Figure 12B:
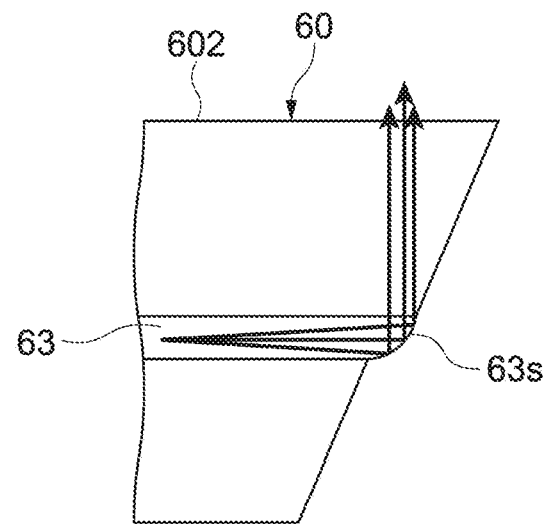
FIG. 12B is a view showing an enlarged side surface of a semiconductor layer of the light emitting device.

FIG. 12A is a cross-sectional view schematically showing a structure of a light emitting device according to a fifth embodiment of the present technology. FIG. 12B is a view showing an enlarged side surface 603 of a semiconductor layer 60 of a light emitting device 100E.

Figure 13:
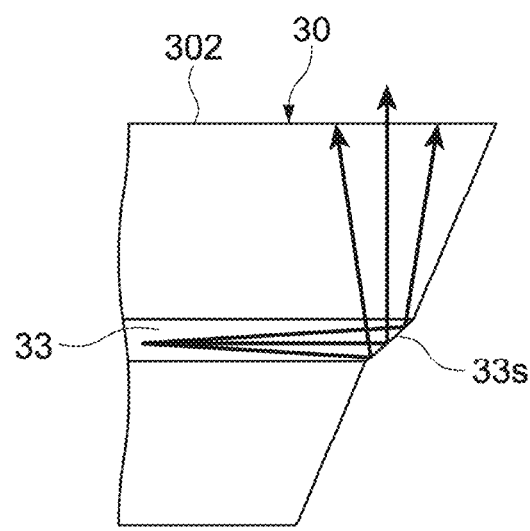
FIG. 13 is a view showing reflected light beam in a case where an extraction surface is flat.

An active layer 63 according to this embodiment has an active layer side surface 63s arranged in a convex shape curved outside. The incident angle ε to the active layer side surface 63s has a distribution and an influence on Expression 2. Thus, as shown in FIG. 13, if β=45 and it is flat, the incident angle δ to the extraction surface 302 also changes (Expression 3) and moves away from an ideal status of δ=0.

As shown in FIG. 12B, a position incident on the active layer side surface 63s of the active layer 63 is different for each light beam. Accordingly, by forming a convex curve with δ=0 for each position at the active layer side surface 63s, the extraction efficiency can be increased.

6. Other Various Embodiments

The present technology is not limited to the above-described embodiments, and other various embodiments may be implemented.

Figure 14A:
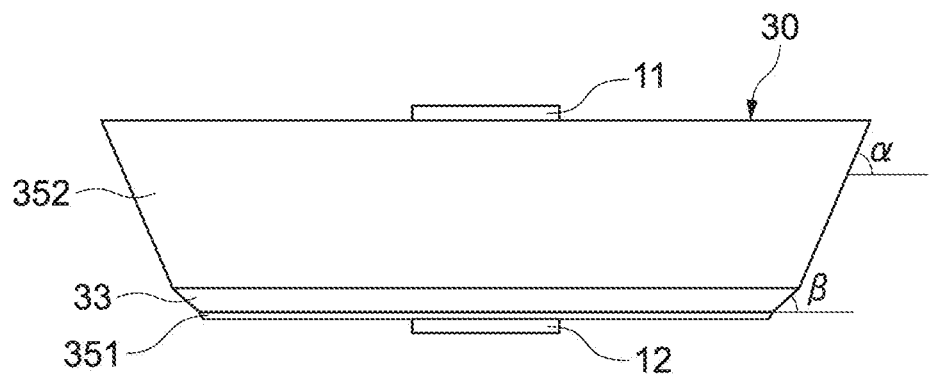
FIGS. 14A, 14B, and 14C each show a shape of cladding layer of the semiconductor layer in a variety of forms.
Figure 14B:
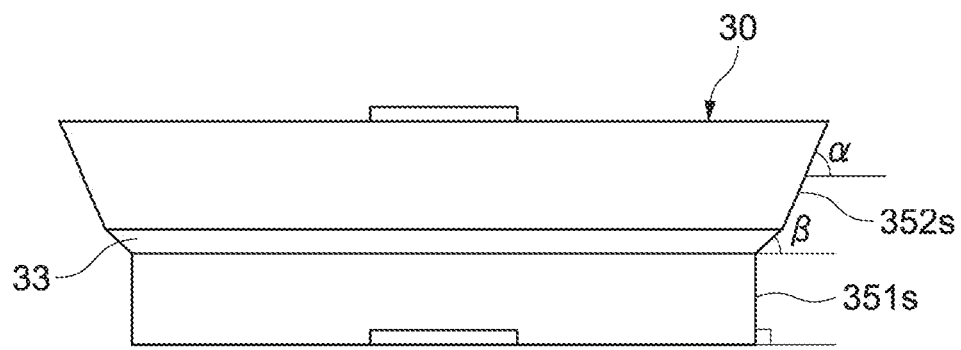
Figure 14C:
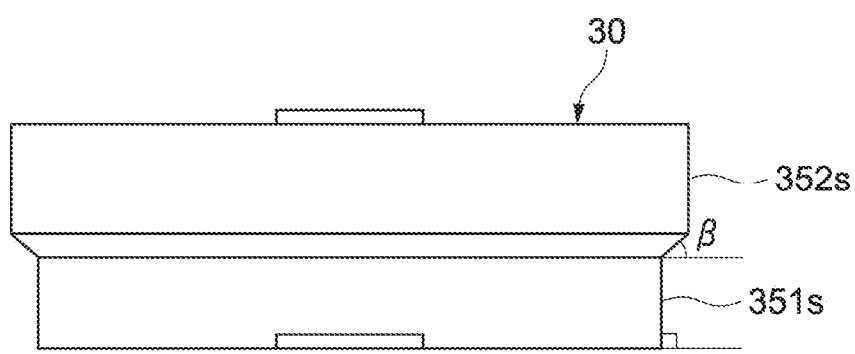

For example, as shown in FIGS. 14A to 14C, the shapes of the cladding layers of the semiconductor layer 30 may take a variety of forms.

For example, as shown in FIGS. 14A, 14B, and 14C, the shapes of the cladding layers of the semiconductor layer 30 may take a variety of forms.

As shown in FIG. 14B, an angle of a lower cladding layer side surface 351s may be different from an angle of an upper cladding layer side surface 352s. In this example, the angle of the lower cladding layer side surface 351s is substantially a right angle.

As shown in FIG. 14C, angles of the upper cladding layer side surface 352s and the lower cladding layer side surface 351s are substantially right angles.

Figure 15A:
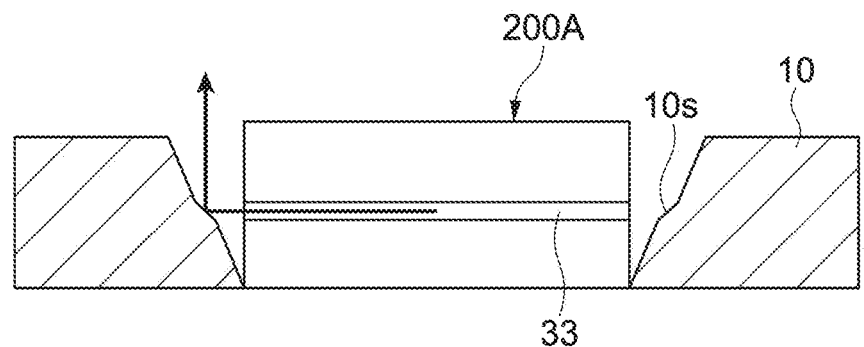
FIGS. 15A and 15B each show a package arranged around a light emitting device.
Figure 15B:
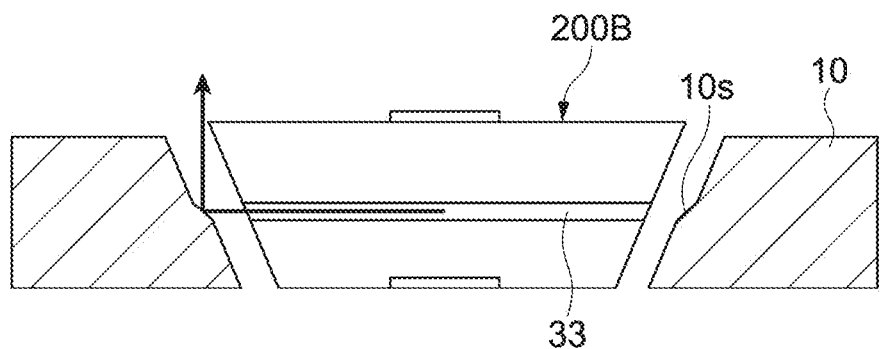

Alternatively, as shown in FIGS. 15A and 15B, each package 10 arranged around a light emitting device 200A or 200B may have a surface 10s having an angle β that receives light from the active layer 33.

Figure 16:
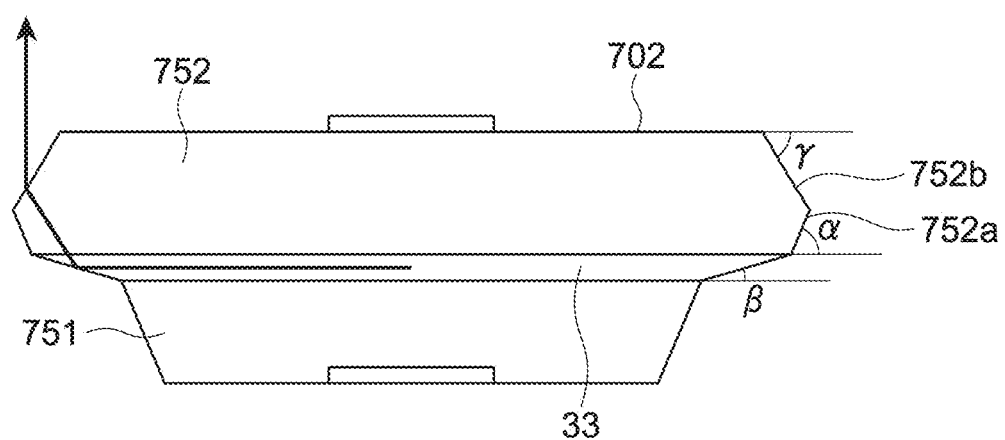
FIG. 16 shows a light emitting device where a cladding layer having an extraction surface has a plurality of side surfaces arranged at different angles.

Alternatively, as shown in FIG. 16, there are cladding layers 751 and 752. The cladding layer 752 having an extraction surface 702 may have a plurality of side surfaces arranged at different angles. In this embodiment, the cladding layer 752 has a first side surface 752a having an angle α and a second side surface 752b having an angle γ. Note that the second side surface 752b has the angle γ that a width (horizontal width) of the cladding layer 752 is increased closer to the active layer 33. By appropriately setting the α, β, and γ, the second side surface 752b functions as the extraction surface.

Examples of the light emitting devices according to the first to fifth embodiments include a light emitting device using an inorganic semiconductor. Also, the present technology is applicable to a light emitting device using an organic semiconductor such as organic EL (Electro-Luminescence) and the like.

Although the above-described embodiments mainly describe that sealing resin is arranged around the semiconductor layer, no resin may be arranged, i.e., air may be arranged around the semiconductor layer.

The light emitting device according to each embodiment has the structure that the electrodes are formed on the both surfaces (upper and bottom surfaces) of the semiconductor layer, respectively. Note that the present technology is applicable to a flip-chip type light emitting device having two electrodes on one surface.

It is possible to combine at least two features of the respective embodiments described above.

REFERENCE SIGNS LIST 30, 40, 60 semiconductor layer
33, 43, 63 active layer
33s, 43s, 63s active layer side surface
35, 351, 352, 751, 752 cladding layer
35s, 351s, 352s cladding layer side surface
48 concave part (part of concavo-convex part)
48a internal surface
58 concavo-convex part
100A, 100B, 100C, 100D, 100E, 200A light emitting device
301 bottom surface
302, 402, 502, 702 extraction surface
303, 403, 603 side surface (of semiconductor layer)
351s cladding layer side surface
752a first side surface
752b second side surface

The invention claimed is:

1. A light emitting device, comprising:
a semiconductor layer that includes:
  a first light extraction surface;
  a plurality of side surfaces;
  a cladding layer, wherein
    the cladding layer includes the first light extraction surface and a cladding layer side surface,
    the cladding layer side surface includes a first side surface and a second side surface,
    the first side surface of the cladding layer side surface is at a first angle to the first light extraction surface, and
    the second side surface of the cladding layer side surface serves as a second light extraction surface; and
  an active layer, wherein
    the active layer includes an active layer side surface,
    the plurality of side surfaces of the semiconductor layer includes the cladding layer side surface of the cladding layer and the active layer side surface of the active layer,
    the active layer side surface is at a second angle to the first light extraction surface,
    the second angle is different from the first angle,
    the first light extraction surface includes a specific surface perpendicular to a lamination direction of the cladding layer and the active layer, and
    the first light extraction surface further includes a concave part such that the following expression is satisfied:

$$h\left(\frac{1}{\tan(180-2\beta)} - \frac{1}{\tan\gamma}\right) \le x \le \frac{d}{\tan(180-2\beta)}$$

where
  x is a distance from a specific point on the specific surface to an edge of an internal surface of the concave part,
  the specific point corresponds to a light incident point of the active layer side surface,
  β is the second angle,
  γ is a third angle of the internal surface of the concave part with respect to the specific surface,
  h is a distance from the specific surface to a bottom surface of the concave part, and
  d is a distance from the specific surface to a center of the active layer.

2. The light emitting device according to claim 1, wherein the specific surface of the first light extraction surface is flat.

3. The light emitting device according to claim 2, wherein
the active layer is configured to generate light,
the active layer side surface is configured to reflect the generated light, and
the reflected light enters the first light extraction surface at an angle smaller than a critical angle based on the second angle of the active layer side surface.

4. The light emitting device according to claim 3, wherein the second angle is represented in degrees by the following expression:

$$\beta = 45 \pm \frac{1}{2}\arcsin\frac{n_2}{n_1}$$

where $n_1$ is a refractive index of the semiconductor layer and $n_2$ is a refractive index of a material around the semiconductor layer.

5. The light emitting device according to claim 2, wherein the second angle is set such that light generated at the active layer and reflected by the active layer side surface exits from the second light extraction surface.

6. The light emitting device according to claim 5, wherein the second angle is represented in degrees by the following expression:

$$\beta = \alpha - 45 \pm \frac{1}{2}\arcsin\frac{n_2}{n_1}$$

where $n_1$ is a refractive index of the semiconductor layer and $n_2$ is a refractive index of a material around the semiconductor layer.

7. The light emitting device according to claim 1, wherein the second angle is set such that light generated at the active layer and reflected by the active layer side surface enters the internal surface of the concave part at an angle smaller than a critical angle.

8. The light emitting device according to claim 7, wherein the second angle is represented in degrees by the following expression:

$$\beta = \frac{1}{2}\left(90 + \gamma - \arcsin\left(\frac{n_2}{n_1}\sin(\gamma)\right)\right)$$

where $n_1$ is a refractive index of the semiconductor layer and $n_2$ is a refractive index of a material around the semiconductor layer.

9. The light emitting device according to claim 1, wherein
the cladding layer further includes a first conductive layer and a second conductive layer,
the first conductive layer includes a third side surface,
the second conductive layer includes the first side surface and the second side surface, and
the third side surface is at a fourth angle to the first light extraction surface.

10. The light emitting device according to claim 9, wherein
the active layer is configured to generate light, and
the active layer is between the first conductive layer and the second conductive layer.

11. The light emitting device according to claim 9, wherein the fourth angle between the third side surface and the first light extraction surface is the same as the first angle between the first side surface and the first light extraction surface.

12. The light emitting device according to claim 9, wherein the fourth angle between the third side surface and the first light extraction surface is different from the first angle between the first side surface and the first light extraction surface.

13. The light emitting device according to claim 9, wherein
the first conductive layer includes a bottom surface of the semiconductor layer,
the first conductive layer is connected to a first electrode at the bottom surface,
the second conductive layer includes the first light extraction surface, and the second conductive layer is connected to a second electrode at the first light extraction surface.

14. The light emitting device according to claim 9, wherein the first conductive layer is thinner than the second conductive layer.

15. The light emitting device according to claim 1, wherein the semiconductor layer further includes an AlGaInP-based material.

16. The light emitting device according to claim 1, further comprising:
    a first electrode on the first light extraction surface; and
    a second electrode on the first light extraction surface.

17. A light emitting device, comprising:
    a semiconductor layer that includes:
        a plurality of side surfaces;
        a cladding layer that includes a light extraction surface; and
        an active layer, wherein
            the active layer includes an active layer side surface,
            the plurality of side surfaces of the semiconductor layer includes the active layer side surface of the active layer,
            the active layer side surface of the active layer is at a first angle to the light extraction surface,
            the light extraction surface of the cladding layer includes a specific surface perpendicular to a lamination direction of the cladding layer and the active layer, and
            the light extraction surface of the cladding layer further includes a concave part such that the following expression is satisfied:

$$h\left(\frac{1}{\tan(180-2\beta)} - \frac{1}{\tan\gamma}\right) \leq x \leq \frac{d}{\tan(180-2\beta)}$$

where
    x is a distance from a specific point on the specific surface to an edge of an internal surface of the concave part,
    the specific point corresponds to a light incident point of the active layer side surface,
    $\beta$ is the first angle,
    $\gamma$ is a second angle of the internal surface of the concave part with respect to the specific surface,
    h is a distance from the specific surface to a bottom surface of the concave part, and
    d is a distance from the specific surface to a center of the active layer.

* * * * *